(12) United States Patent
Joo et al.

(10) Patent No.: US 6,534,401 B2
(45) Date of Patent: *Mar. 18, 2003

(54) METHOD FOR SELECTIVELY OXIDIZING A SILICON/METAL COMPOSITE FILM STACK

(75) Inventors: Hyun Sung Joo, San Ramon, CA (US); David R. Lopes, Sunnyvale, CA (US)

(73) Assignee: Applied Materials, Inc., Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/561,195

(22) Filed: Apr. 27, 2000

(65) Prior Publication Data

US 2002/0172756 A1 Nov. 21, 2002

(51) Int. Cl.⁷ .............................. H01L 21/44; B05D 5/12
(52) U.S. Cl. ..................... 438/653; 438/585; 438/592; 438/225; 438/297; 438/439; 438/453; 427/96; 427/377; 427/383.1
(58) Field of Search ................................ 438/585, 592, 438/653, 225, 297, 439, 453; 427/96, 377, 383.1

(56) References Cited

U.S. PATENT DOCUMENTS

| | | | |
|---|---|---|---|
| 5,851,892 A | | 12/1998 | Lojek et al. |
| 6,037,273 A | | 3/2000 | Gronet et al. |
| 6,096,640 A | * | 8/2000 | Hu ............................... 438/652 |
| 6,100,188 A | * | 8/2000 | Lu et al. ...................... 438/653 |
| 6,306,743 B1 | * | 10/2001 | Lee ............................. 438/592 |
| 6,323,115 B1 | * | 11/2001 | Tanabe et al. .............. 438/592 |
| 6,458,714 B1 | * | 10/2002 | Powell et al. ............... 437/770 |

FOREIGN PATENT DOCUMENTS

| | | | |
|---|---|---|---|
| EP | 0910119 A2 | | 4/1999 |
| EP | 0964437 A2 | | 12/1999 |
| EP | 964437 | * | 12/1999 |

OTHER PUBLICATIONS

Lin, B. et al., "Selective Oxidation of SI in the Presence of W and WN" Materials Research Society Symposium Proceedings, Materials Research Society, Pittsburg, PA, vol. 525, Apr. 1998, pp. 359–364, XP000879331.

Lee, B.H. et al., "In–Situ Barrier Formation for High Reliable W/Barrier/Poly–Si Gate Using Denudation of WNX of Polycrystalline Si" International Electron Devices Meeting 1998, IEDM Technical Digest, San Francisco, CA Dec. 6–9, 1998, New York, NY, IEEE, Dec. 6, 1998, pp. 385–388, XP000859395.

Chandorkar, A. N. et al., "Dependence of Partial Pressure of H2O on Pyrogenic Growth of Silicon Dioxide", Journal of the Electrochemical Society, Electomechanical Society, Manchester, NH, vol. 132, No. 2, Feb. 1, 1985, pp. 415–417, XP002073678.

(List continued on next page.)

Primary Examiner—Brian K. Talbot
(74) Attorney, Agent, or Firm—Blakely Sokoloff Taylor & Zafman

(57) ABSTRACT

A method of selectively oxidizing a composite film. According to the present invention a substrate of having a composite film comprising of lower silicon film, a barrier layer, and upper metal film on the barrier layer is placed into a reaction chamber. An inert gas is then fed into reaction chamber to create an inert ambient in the reaction chamber. The temperature of the substrate is then raised or ramped from first temperature to a second temperature in the inert ambient. After the temperature of the substrate is raised to the second temperature the substrate is exposed to an ambient which oxidizes the silicon but which does not oxidize the metal.

20 Claims, 4 Drawing Sheets

OTHER PUBLICATIONS

Lee, B.H. "Denuded–WNx/Poly–Si Gate Technology for Deep Sub–Micron–CMOS" ICVC '99, 6th International Conference on VLSI and CAD ISBN 0–7803–5727–2, Oct. 26–27, 1999, pp. 225–228, XP000984323, Seoul, South Korea.

Joo, H.S. et al. "A Novel Method for Selective Oxidation of W/WNx/Poly Gate Stack Using RTP ISSG Technique" Electromechanical Society Proceedings, No. 99–18, 1999, pp. 203–209, XP001019637.

International Search Report, PCT/US 01/13727, Aug. 2001.

* cited by examiner

METHOD FOR SELECTIVELY OXIDIZING A SILICON/METAL COMPOSITE FILM STACK

BACKGROUND OF THE INVENTION

1. Field of the Invention

The present invention relates to the field of semiconductor manufacturing and more specifically to a method and apparatus for the selective oxidation of a composite silicon/metal film.

2. Discussion of Related Art

In the fabrication of modern integrated circuits such as microprocessors and memories, selective oxidation processes are used to passivate or oxidize silicon films without oxidizing metal films contained thereon. For example, electrodes and interconnects can be made of composite silicon/barrier layer/metal films. The purpose of the barrier layer is to prevent diffusion and interaction between the silicon film and the metal film which can cause the formation a higher resistance metal silicide film. Unfortunately, during some selective oxidation processes, such as hydrogen rich (greater than 80% $H_2$) $H_2/H_2O$ ambients used to form an oxide on a silicon film but not on the metal, the barrier layer can be attacked by $H_2$ and its integrity compromised leading to the undesired formation of a metal silicide resulting in a higher resistance composite film.

Thus what is desired is a method of selectively oxidizing a composite film in a hydrogen rich $H_2/H_2O$ ambient without affecting the integrity of the barrier layer.

SUMMARY OF THE INVENTION

A method of selectively oxidizing a composite film. According to the present invention a substrate having a composite film comprising of lower silicon film, a barrier layer, and upper metal film on the barrier layer is placed into a reaction chamber. An inert gas is then fed into reaction chamber to create an inert ambient in the reaction chamber. The temperature of the substrate is then raised or ramped from first temperature to a second temperature in the inert ambient. After the temperature of the substrate is raised to the second temperature the substrate is exposed to an ambient which oxidizes the silicon but which does not oxidize the metal.

DETAILED DESCRIPTION OF THE PRESENT INVENTION

Figure 1:
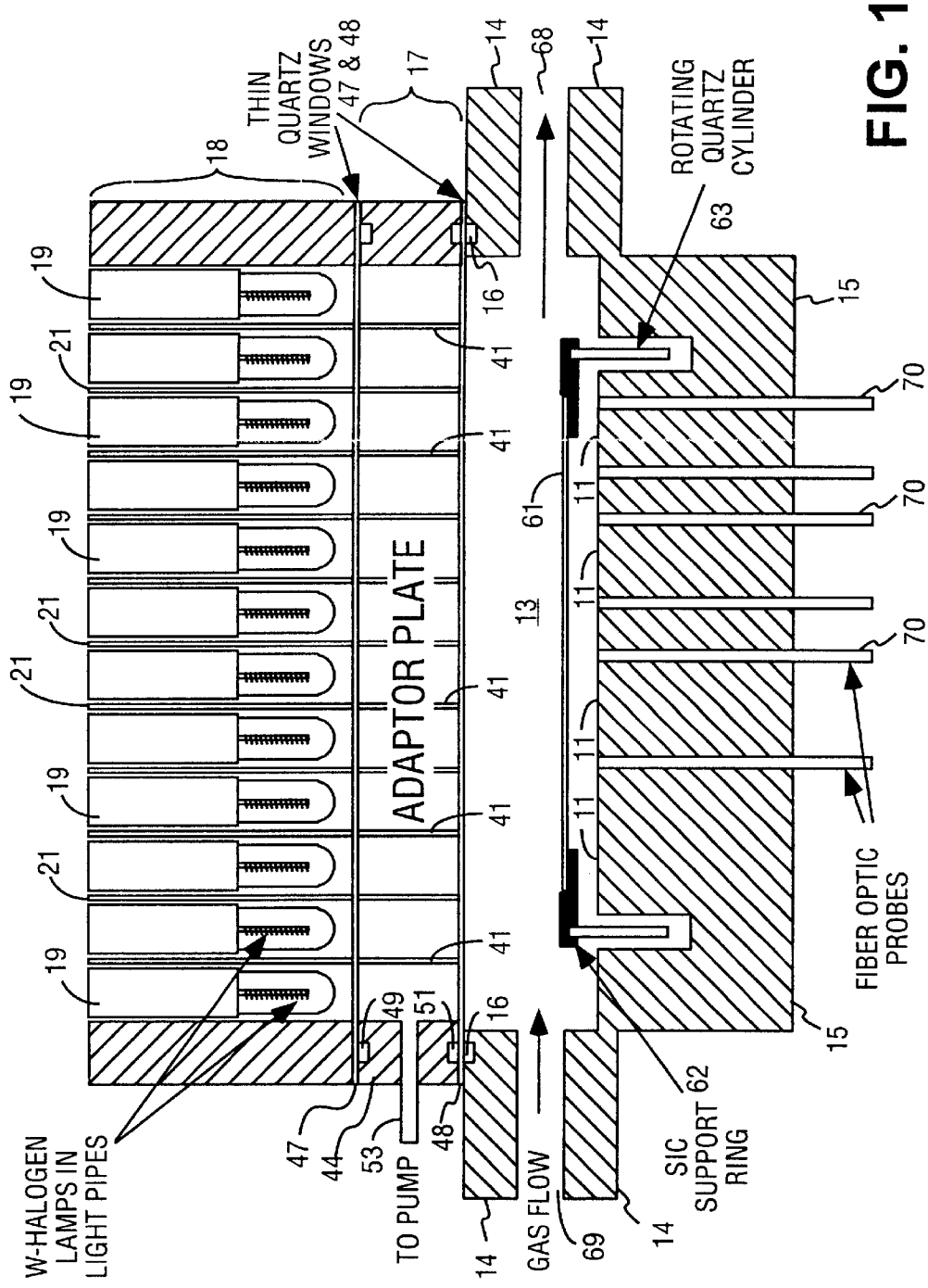
FIG. 1 is an illustration of a rapid thermal heating apparatus which can implement the selective oxidation process of the present invention.

The present invention describes a novel method an apparatus for improving the barrier qualities of a barrier layer during the selective oxidation of a silicon/metal electrode. In the following description numerous specific details such as apparatus configurations as well as process specifics such as time and temperature are set forth in order to provide a thorough understanding of the present invention. One skilled in the art will appreciate the ability to use alternative configuration and process details to the disclosed specifics without parting from the scope of the present invention. In other instances well known semiconductor processing equipment and techniques have not been described in detail in order to not unnecessarily obscure the present invention.

The present invention describes a novel method of selectively oxidizing a silicon/metal composite electrode. According to the present invention, a substrate having a composite electrode is placed in a reaction chamber. In an embodiment of the present invention the composite electrode includes a lower polysilicon film, a tungsten nitride barrier layer formed on the polysilicon film, and a tungsten film disposed on the tungsten nitride barrier. An inert gas, such as $N_2$, is then provided into the chamber to form an inert ambient therein. The temperature of the substrate is then ramped up from a temperature of less than 100° C. to a second higher oxidation temperature of greater than 800° C. By flowing in an inert gas during the temperature ramp, the tungsten nitride barrier layer is cured during the ramp which improves the quality and performance of the barrier layer. Once the oxidation temperature is reached the inert gas is switched to a selective oxidation process gas mix comprising hydrogen ($H_2$) and oxygen ($O_2$). The hydrogen gas and oxygen gas flow into the chamber where the heated substrate causes the hydrogen and oxygen to react and form steam ($H_2O$) vapor in the chamber. The $H_2$ and $O_2$ gases are fed into the reaction chamber in such a ratio so as to produce a $H_2/H_2O$ ambient which can selectively oxidize the lower silicon portion of the electrode without oxidizing the tungsten film or the tungsten nitride barrier. Because the tungsten nitride barrier layer is cured during the temperature ramp the selective oxidation process can use any $H_2/H_2O$ ambient including $H_2$ rich ambients (greater than or equal to 80% $H_2$). Additionally, because $H_2$ and $O_2$ are not fed into the reaction chamber until a suitable high oxidation temperature greater than or equal to 800° C. is reached, any $H_2/H_2O$ ambient can be formed and still obtain a selective oxidation.

The selective oxidation process of the present invention is preferably carried out in a rapid thermal heating apparatus, such as but not limited to, the Applied Materials, Inc. RTP Centura with a Honeycomb Source. Another suitable rapid thermal heating apparatus and its method of operation is set forth in U.S. Pat. No. 5,155,336 assigned to the Assignee of the present application. Additionally, although the selective oxidation process of the present invention is preferably carried out in a rapid thermal heating apparatus, other types of thermal reactors may be utilized such as the Epi or Poly Centura single wafer "cold wall" reactor by Applied Materials used to form high temperature films (HTF) such as epitaxial silicon, polysilicon, oxides and nitrides.

Figure 2:
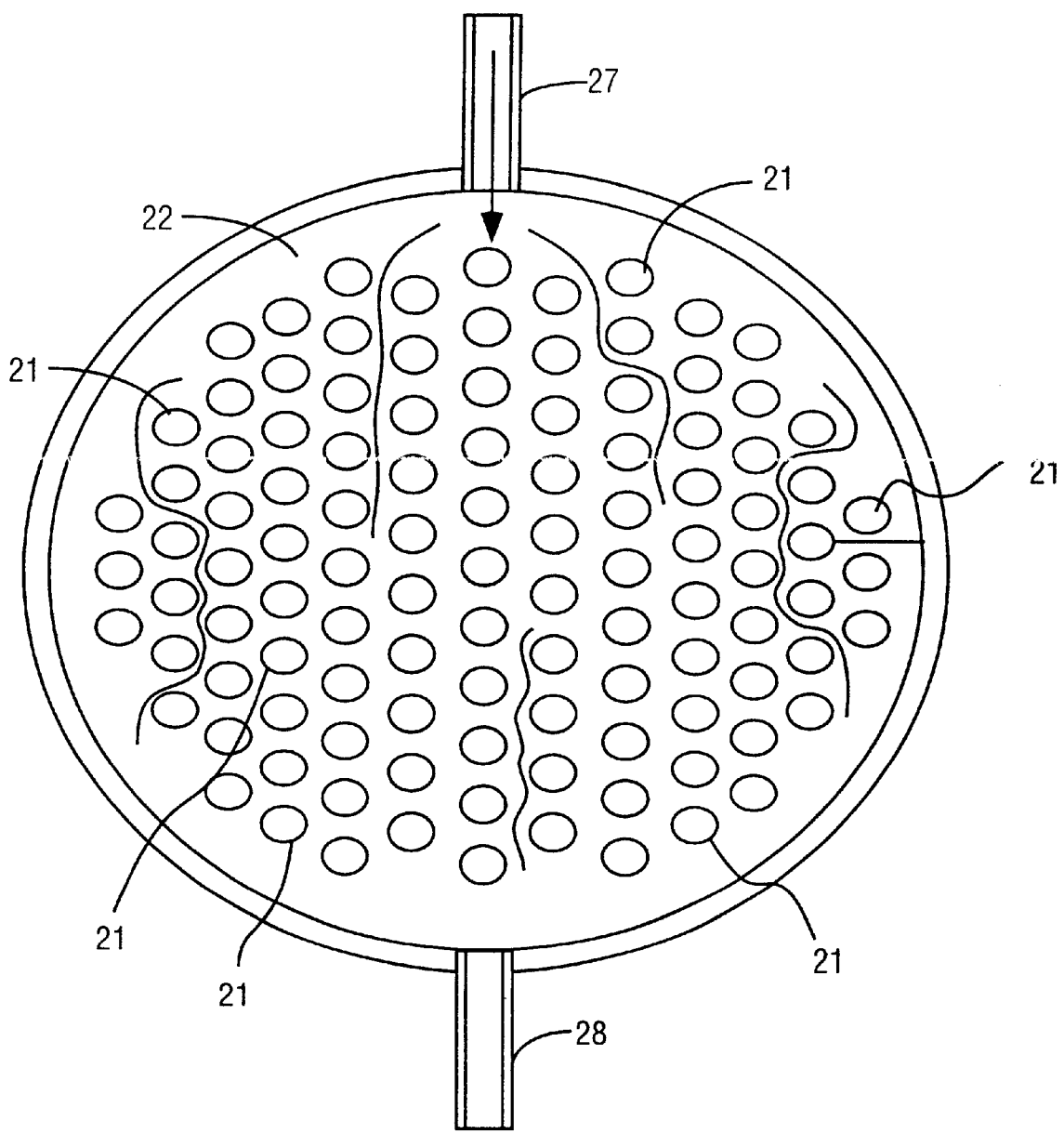
FIG. 2 is an illustration of the light source placement in the rapid thermal heating apparatus of FIG. 1.

FIGS. 1 and 2 illustrate a rapid thermal heating apparatus 100 which can be used to carry out the selective oxidation process of the present invention. Rapid thermal heating apparatus 100, as shown in FIG. 1, includes an evacuated process chamber 13 enclosed by a sidewall 14 and a bottom wall 15. Sidewall 14 and bottom wall 15 are preferably made of stainless steel. The upper portion of sidewall 14 of chamber 13 is sealed to window assembly 17 by "O" rings 16. A radiant energy light pipe assembly 18 is positioned over and coupled to window assembly 17. The radiant energy assembly 18 includes a plurality of tungsten halogen lamps 19, for example Sylvania EYT lamps, each mounted into a light pipe 21 which can be a stainless steel, brass, aluminum or other metal.

A substrate or wafer 61 is supported on its edge in side chamber 13 by a support ring 62 made up of silicon carbide. Support ring 62 is mounted on a rotatable quartz cylinder 63. By rotating quartz cylinder 63 support ring 62 and wafer 61 can be caused to rotate. An additional silicon carbide adapter ring can be used to allow wafers of different diameters to be processed (e.g., 150 mm as well as 200 mm). The outside edge of support ring 62 probably extends less than two inches from the outside diameter of wafer 61. The volume of chamber 13 is approximately two liters.

The bottom wall 15 of apparatus 100 includes a gold coated top surface 11 for reflecting energy onto the backside of wafer 61. Additionally, rapid thermal heating apparatus 100 includes a plurality of fiber optic probes 70 positioned through the bottom wall 15 of apparatus 100 in order to detect the temperature of wafer 61 at a plurality of locations across its bottom surface. Reflections between the backside of the silicon wafer 61 and reflecting surface 11 create a blackbody cavity which makes temperature measurement independent of wafer backside emissivity and thereby provides accurate temperature measurement capability.

Rapid thermal heating apparatus 100 includes a gas inlet 69 formed through sidewall 14 for injecting process gas into chamber 13 to allow various processing steps to be carried out in chamber 13. Coupled to gas inlet 69 is a source, such as a tank, of oxygen containing gas such as $O_2$ and a source, such as a tank, of hydrogen containing gas such as $H_2$. Positioned on the opposite side of gas inlet 69, in sidewall 14, is a gas outlet 68. Gas outlet 68 is coupled to a vacuum source, such as a pump, to exhaust process gas from chamber 13 and to reduce the pressure in chamber 13. The vacuum source maintains a desired pressure while process gas is continually fed into the chamber during processing.

Lamps 19 include a filament wound as a coil with its axis parallel to that of the lamp envelope. Most of the light is emitted perpendicular to the axis towards the wall of the surrounding light pipe. The light pipe length is selected to at least be as long as the associated lamp. It may be longer provided that the power reaching the wafer is not substantially attenuated by increased reflection. Light assembly 18 preferably includes 187 lamps positioned in a hexagonal array or in a "honeycomb shape" as illustrated in FIG. 2. Lamps 19 are positioned to adequately cover the entire surface area of wafer 61 and support ring 62. Lamps 19 are grouped in zones which can be independently controlled to provide for extremely uniform heating of wafer 61. Heat pipes 21 can be cooled by flowing a coolant, such as water, between the various heat pipes. The radiant energy source 18 comprising the plurality of light pipes 21 and associated lamps 19 allows the use of thin quartz windows to provide an optical port for heating a substrate within the evacuative process chamber.

Window assembly 17 includes a plurality of short light pipes 41 which are brazed to upper/lower flange plates which have their outer edges sealed to an outer wall 44. A coolant, such as water, can be injected into the space between light pipes 41 to serve to cool light pipes 41 and flanges. Light pipes 41 register with light pipes 21 of the illuminator. The water cooled flange with the light pipe pattern which registers with the lamp housing is sandwiched between two quartz plates 47 and 48. These plates are sealed to the flange with "O" rings 49 and 51 near the periphery of the flange. The upper and lower flange plates include grooves which provide communication between the light pipes. A vacuum can be produced in the plurality of light pipes 41 by pumping through a tube 53 connected to one of the light pipes 41 which in turn is connected to the rest of the pipes by a very small recess or groove in the face of the flange. Thus, when the sandwiched structure is placed on a vacuum chamber 13 the metal flange, which is typically stainless steel and which has excellent mechanical strength, provides adequate structural support. The lower quartz window 48, the one actually sealing the vacuum chamber 13, experiences little or no pressure differential because of the vacuum on each side and thus can be made very thin. The adapter plate concept of window assembly 17 allows quartz windows to be easily changed for cleaning or analysis. In addition, the vacuum between the quartz windows 47 and 48 of the window assembly provides an extra level of protection against toxic gasses escaping from the reaction chamber.

Rapid thermal heating apparatus 100 is a single wafer reaction chamber capable of ramping the temperature of a wafer 61 or substrate at a rate of 25–100° C./sec. Rapid thermal heating apparatus 100 is said to be a "cold wall" reaction chamber because the temperature of the wafer during the oxidation process is at least 400° C. greater than the temperature of chamber sidewalls 14. Heating/cooling fluid can be circulated through sidewalls 14 and/or bottom wall 15 to maintain walls at a desired temperature. For a selective steam oxidation process utilizing insitu moisture generation, chamber walls 14 and 15 are maintained at a temperature greater than room temperature (23° C.) in order to prevent condensation. Rapid thermal heating apparatus 100 is preferably configured as part of a "cluster tool" which includes a load lock and a transfer chamber with a robotic arm.

Figure 3:
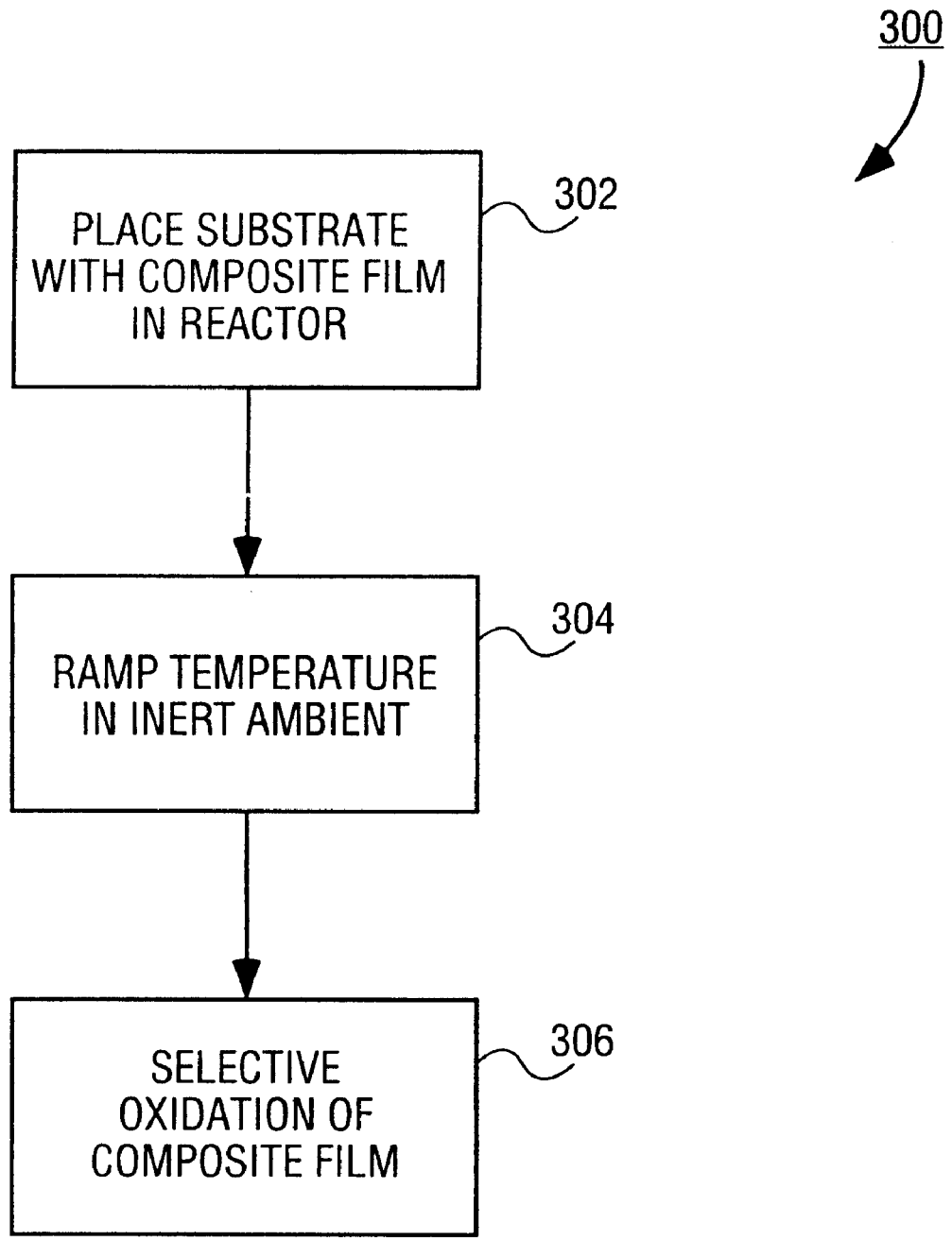
FIG. 3 is a flowchart which illustrates a method of selectively oxidizing a composite film according to the present invention.

A method of selectively oxidizing a composite silicon/metal film stack according to the present invention is illustrated in flow chart 300 of FIG. 3. The method of the present invention will be described with respect to a selective oxidation in the rapid thermal heating apparatus illustrated in FIGS. 1 and 2. Additionally, the oxidation process of the present invention will be described with respect to a selective steam oxidation or passivation of a composite silicon/tungsten nitride/tungsten gate electrode 402 and a silicon substrate 406 of a silicon wafer 61 as shown in FIG. 4A.

This first step according to the present invention as set forth in block 302 of flowchart 300 is to move a wafer of substrate having a silicon/barrier layer/metal composite film stack into vacuum chamber 13 of apparatus 100. FIG. 4A shows a composite gate electrode 402 formed on a gate insulating layer 404 such as silicon oxide or silicon oxynitride which in turn is formed on a doped silicon substrate 406. As shown in FIG. 4A the composite gate stack 402 includes a lower polycrystalline silicon film 408 formed on gate insulating layer 404, a tungsten nitride (WNx) barrier layer 410 disposed on the lower polysilicon layer 408 and a tungsten metal layer 412 disposed on the tungsten nitride barrier layer 410. The purpose of the tungsten metal layer 412 is to provide a low resistance film in order to reduce the overall resistance of the composite gate electrode 402. The purpose of the tungsten nitride (WNx) barrier layer 410 is to prevent the interaction between silicon film 404 and tungsten film 410 during high temperature processing so that the tungsten film does not react with the silicon film and form an undesired higher resistance (WSix) film.

Composite gate electrode 402 can be formed by first blanket depositing onto a gate insulating layer 404 an amorphous or polycrystalline silicon film by well-known techniques such as by chemical vapor deposition (CVD) or by physical vapor deposition (PVD) to a thickness between 200–800 Å. The silicon film can be undoped but is preferably doped to concentration level greater than $1\times10^{19}$ atoms/cm$^-$. The silicon film can be doped insitu (i.e., during the deposition of the silicon film) or can be subsequently doped after deposition by for example ion implantation. Next, a tungsten nitride barrier layer can be blanket deposited onto the silicon film 408 by well-known techniques such as by PVD or CVD. The tungsten nitride barrier layer is preferably formed as thin as possible, less than 100 Å, in order to not adversely affect the resistivity of the composite electrode 402 but yet is formed thick enough to sufficiently prevent the interaction between silicon film 408 and subsequently deposited tungsten film 412. A tungsten nitride barrier having a thickness between 25–75 Å with 50 Å being preferred has been found to be suitable. Next, a tungsten film is blanket deposited over tungsten nitride barrier 410 by any well-known technique such as PVD or CVD to a thickness between 200–700 Å. The blanket deposited silicon, tungsten nitride, and tungsten films can then be patterned into a gate electrode utilizing well-known photolithography and etching techniques such as but not limited to reactive ion etching or plasma etching.

Figure 4A:
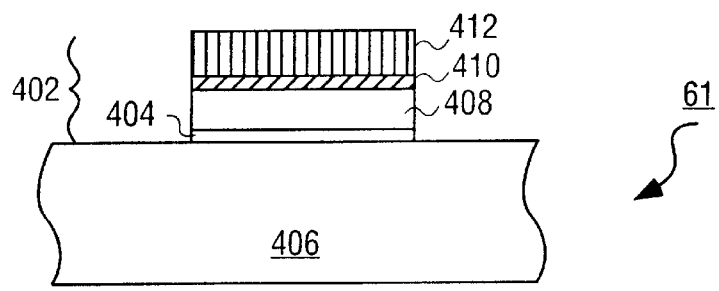
FIG. 4A is a cross sectional view of a semiconductor wafer substrate prior to selective oxidation process of the present invention.

It is to be appreciated that although the selective oxidation process of the present invention is ideally suited for selectively oxidizing a composite polysilicon/tungsten nitride/tungsten gate electrode stack 402 shown in FIG. 4A, the present invention is equally useful for selectively oxidizing other composite silicon/barrier metal/metal film stacks. For example, although barrier metal 410 is preferably tungsten nitride (WNx) other suitable barrier metals such as but not limited to titanium nitride (TiN) may be used. Similarly, although metal layer 410 is preferably tungsten (W) other metal layers such as but not limited to cobalt (Co) and titanium (Ti) maybe used. Still further it is to be appreciated that the composite film need not necessarily be used to form a gate electrode but can be used to form other device features such as but not limited to capacitor electrodes and interconnects.

Next, as set forth in block 304 of flowchart 300, chamber 13 is filled with an inert ambient and the temperature of the substrate raised from the transfer temperature of about room temperature to a selective oxidation temperature of between 800–1100° C.

Figure 4B:
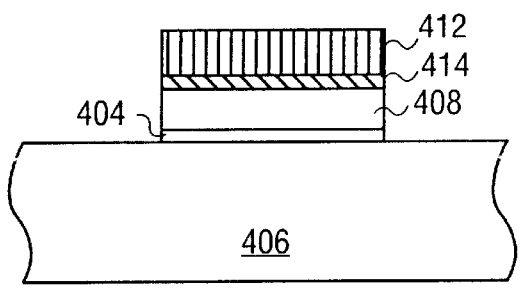
FIG. 4B is an illustration of a cross sectional view showing the substrate of FIG. 4A after ramping the temperature of the substrate to a selective oxidation temperature in an inert ambient.

During the temperature ramp only inert gas such as nitrogen ($N_2$), helium (He), argon (Ar) and Xeon (Xe) is provided into the chamber 13 so that only an inert ambient is present during the temperature ramp. An inert gas is a gas which will not react with metal layer 412 during the temperature ramp. According to the present invention the process parameters of temperature ramp rate, inert gas flow rate, and chamber pressure are controlled so that the barrier layer 410 is sufficiently cured during the inert gas temperature ramp to form a cured barrier layer 414 as shown in FIG. 4B. A cured barrier layer 414 is a barrier with improved barrier properties for preventing diffusion and reaction between metal film 412 and silicon film 408.

In an embodiment of the inert temperature ramp of present invention, wafer 61 is transferred into chamber 13 at a temperature of less than 100° C. and preferably between room temperature and 100° C. The temperature of war 61 (and silicon carbide ring 62) are then heated to a selective oxidation temperature of at least 800° C. and preferably between 950–1100° C. by applying power to lamps 19 to irradiate wafer 61 and silicon carbide ring 62. The wafer temperature is raised at rate between 25–75° C./second. During the temperature ramp, nitrogen gas ($N_2$) is fed into chamber 13 at a flow rate between 2–10 SLM (standard liters per minute) while the total pressure in the chamber 13 is maintained at between 50–250 torrs with 100 torr being preferred. The flow of inert gas into chamber 13 is continued until the temperature at which selective oxidation is to occur is reached. Such a process will sufficiently cure barrier layer 410 and in the case of a tungsten nitride (WN) barrier transform it into a tungsten nitride silicon film 414.

Figure 4C:
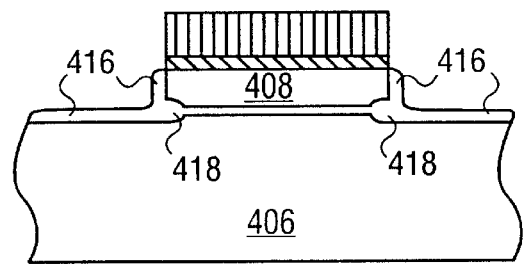
FIG. 4C is an illustration of a cross sectional view showing the substrate of FIG. 4C after a selective oxidation process of the present invention.

Next, as set forth in block 306 of flow chart 300, once the desire selective oxidation temperature is reached the inert gas flow is immediately switched to create an ambient which can selectively oxidize a composite gate electrode (i.e., oxidize silicon film 408 and substrate 406 without oxidizing metal film 412 and cured barrier layer 414) as shown in FIG. 4C. In an embodiment of the present invention the selective oxidation occurs by generating or providing an $H_2/H_2O$ ambient in chamber 13. In an embodiment of the present invention the selective oxidation occurs in a hydrogen rich low $H_2O$ ambient. In a preferred embodiment the selective oxidation ambient includes less than or equal to 20% $H_2$ (ideally between 5–20% $H_2O$) with the remainder $H_2$ (ideally between 80–95% $H_2$). In an embodiment of the present invention the selective oxidation ambient consist of only $H_2$ and $H_2O$.

In an embodiment of the present invention the $H_2/H_2O$ ambient is formed by an "in-situ steam generation" (ISSG) process. In an in-situ steam generation process, an oxidation process gas mix including a hydrogen containing gas, such as but not limited to $H_2$ and an oxygen containing gas such as but not limited to $O_2$ is fed into chamber 13 where heat from the wafer 61 and silicon carbide support ring 62 causes the hydrogen containing gas and the oxygen containing gas to react to form moisture or steam ($H_2O$).

Although hydrogen ($H_2$) is the preferred hydrogen containing gas, other hydrogen containing gases such as $NH_3$ can be utilized. Similarly although oxygen ($O_2$) is the preferred oxygen containing gas other oxygen containing gases such as $N_2O$ may be utilized if desired.

Since rapid thermal heating apparatus 100 is a "cold wall" reactor, the only sufficiently hot surface is in chamber 13 to initiate the reaction is the wafer 61 and support ring 62. As such, in the present invention the moisture generating reaction occurs near, about 1 cm from, the surface of wafer 61. In apparatus 100 the moisture generation reaction is confined to within about two inches of the wafer or about the amount which support ring 62 extends past the outside edge of wafer 61. Since it is the temperature of the wafer (and support ring) which initiates or turns "on" the moisture generation reaction, the reaction is said to be thermally controlled by the temperature of wafer 61 (and support ring 62). Additionally the vapor generation reaction of the present invention is said to be "surface catalyzed" because the heated surface of the wafer is necessary for the reaction to occur however it is not consumed in the reaction which forms the water vapor.

A preferred 80–95% $H_2$/20–5% $H_2O$ ambient can be formed by ISSG by providing a oxidation process gas mix having a concentration ratio of between 2.5–10 molecular percent $O_2$ and the remainder $H_2$ (i.e., between 97.5–90 molecular percent $H_2$). A suitable ambient can be formed by providing an oxidation process gas mix consisting of the desired concentration of $H_2$ and $O_2$ at a rate between 5–20 SLM into chamber 13 while maintaining the total pressure in chamber 13 at between 50–250 torr with 100 torr being preferred. During the selective oxidation the temperature of wafer 61 is maintained above 800° C. and preferably between 950–1100° C.

In an embodiment of the present invention utilizing ISSG, a small amount of $H_2$ is "bled" into chamber 13 prior to initiating the flow of $O_2$ so that very little $O_2$ is present with $H_2$ during the initial reaction of $O_2$ and $H_2$. By keeping the initial concentration of $O_2$ in $H_2$ very low during the initial reaction the spontaneous combustion of the entire volume of oxidation process gas in chamber 13 can be prevented. Once the reaction has been initiated and the existing oxidation process gas volume begins to deplete, the concentration ratio can be increased to desired level. In this way, the amount of fuel available at the start of the reaction is kept small and safe operating conditions assured.

In alternative embodiment to utilizing an insitu moisture generation process to form the wet ambient, and ex-situ process can be used. In an ex-situ process the $H_2/H_2O$ ambient of the desired concentration is formed external to chamber 13, by for example an pryogenic torch. The externally formed $H_2/H_2O$ ambient can then be fed into chamber 13. Because the highly combustive moisture ($H_2O$) generating reaction occurs external to chamber 13, the selective oxidation process in chamber 13 can occur at atmospheric pressure. A selective oxidation process at atmospheric pressure is desirable because the oxidation rate is higher than at reduced pressure. Additionally, if the selective oxidation process utilizes an ex-situ generated wet ambient at atmospheric pressure than the inert temperature ramp also preferably occurs at atmospheric pressure. It is to be appreciated that it is desirable to conduct the inert temperature ramp at the same pressure at which the selective oxidation occurs.

The pressure, process gas flow, and wafer temperature are held constant for a sufficient amount of time to enable the wet ambient to selectively oxidize the composite film stack as shown in FIG. 4C. The process time and temperature as well as the concentration of the process gas generally dictate the thickness of the formed oxide film 416. Wafer 61 will typically be held at selective oxidation temperature for between 30–120 seconds. As shown in FIG. 4C, the $H_2/H_2O$ ambient oxidizes the side walls of silicon electrode 408 and the surface of silicon substrate 406 to grow a silicon oxide film 416 thereon. The ambient, however, does not oxidize tungsten metal film 412 nor cured tungsten metal nitride barrier layer 414. The purpose of the oxidation of silicon film 408 and substrate 406 is to form a birds beak 418 (i.e., a slightly thicker gate oxide layer at the edges of the gate electrode) in order to cure edge effects and to improve the electrical performance of a subsequently fabricated MOS transistor. Additionally the selective oxidation also cures defects in silicon substrate 406. It is advantageous to cure defects in the silicon substrate 406 prior to source/drain ion implantation steps after which curing of substrate 406 becomes difficult. A selective oxidation is necessary to prevent the oxidation of metal film 412 and barrier layer 414 which if oxidized would increase the resistance of the fabricated gate electrode and detrimentally affect the performance of the fabricated transistor. Growing a silicon owe film 416 having a thickness between 20–100 Å has been found to be desirable.

Because the tungsten nitride barrier layer was cured in an inert ambient during the temperature ramp to the selective oxidation process temperature, it can withstand exposure to hydrogen rich (i.e., greater than 80% $H_2$) $H_2/H_2O$ ambients without breaking down. It is to be appreciated that if not cured, when exposed to a hydrogen rich ambient the barrier layer would break down causing the undesired reaction between silicon film 408 and tungsten film 412 which would lead to undesired formation of tungsten silicide and a resulting increase in resistance and degradation in performance. By curing the barrier layer during the ramp the present invention enables any $H_2/H_2O$ ambient to be utilized including an anneal in only $H_2$ without a breakdown of the barrier layer. Additionally by curing the tungsten nitride film during the temperature ramp for the selective oxidation process, the need for a separate anneal of the barrier film is eliminated thereby providing a selective oxidation process with a minimized thermal budget.

Figure 4D:
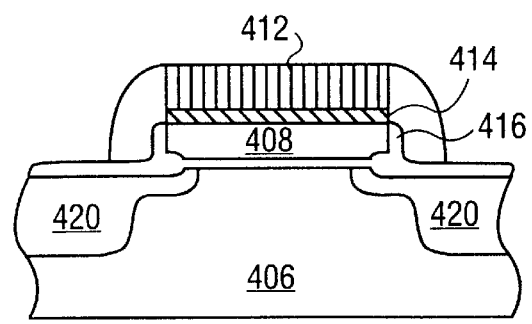
FIG. 4D is an illustration of a cross sectional view showing the formation of source/drain regions in the substrate of FIG. 4C.

Once a sufficiently thick oxide 416 has been formed on silicon film 408 and substrate 406 the selective oxidation process is stopped by stopping the flow of the oxidation process gases into chamber 13 and decreasing the temperature of wafer 61. At this time the selective oxidation process of the present invention is complete. Well-known semiconductor manufacturing processes can be used to complete the formation of a MOS transistor. For example, well-know ion plantation and spacer techniques can be used to form source/drain regions 420 as show in FIG. 4D.

Thus a method and apparatus for the selective oxidation of a silicon/metal composite film has been described.

We claim:

1. A method of selectively oxidizing a composite film comprising:
    placing a substrate having a composite film comprising a lower silicon film, a barrier layer and an upper metal film on the barrier layer in a chamber;
    flowing an inert gas into said chamber to create an inert ambient in said chamber;
    ramping the temperature of said substrate from a first temperature to a second temperature while flowing said inert gas in said chamber; and
    after ramping said temperature of said substrate to said second temperature, exposing said substrate to oxidizing ambient which oxidizes said silicon film and not said metal film.

2. The method of claim 1 wherein said oxidizing ambient comprises $H_2O$.

3. The method of claim 2 wherein said $H_2O$ is formed by reacting $H_2$ and $O_2$ in said chamber.

4. The method of claim 1 wherein said first temperature is less than 100° C.

5. The method of claim 1 wherein said second temperature is greater than 800° C.

6. The method of claim 1 wherein said inert gas is nitrogen ($N_2$).

7. A method of selecting oxidizing a composite electrode comprising:
    placing a substrate into a reaction chamber, said substrate having an electrode comprising a lower polysilicon film, a tungsten nitride barrier layer on the polysilicon film, and a tungsten film on the tungsten nitride barrier layer;
    providing an inert gas into said chamber to create an inert ambient in said chamber;
    ramping the temperature of said substrate from a first temperature to a second temperature while providing said inert gas in said chamber; and
    after ramping said temperature of said substrate to said second temperature forming an oxidizing ambient in said chamber which selectively oxidizes said composite electrode.

8. The method of claim 7 wherein said second temperature is greater than or equal to 800° C.

9. The method of claim 8 wherein said second temperature is between 950° C. and 1100° C.

10. The method of claim 7 wherein said first temperature is less than 100° C.

11. The method of claim 10 wherein said first temperature is between room temperature and 100° C.

12. The method of claim 7 wherein said inert gas in nitrogen ($N_2$).

13. The method of claim 7 wherein said inert gas is argon (Ar).

14. The method of claim 7 wherein said inert gas is helium (He).

15. The method of claim 7 wherein said inert gas is Xeon (Xe).

16. The method of claim 7 wherein said selective oxidation occurs in a $H_2/H_2O$ ambient.

17. The method of claim 16 wherein said $H_2/H_2O$ ambient comprises less than or equal to 20% $H_2O$ during said oxidation.

18. The method of claim 16 wherein said $H_2/H_2O$ ambient is formed by flowing between 2.5–10% molecular percent $O_2$ and between 97.5–90% $H_2$ into said chamber and reacting said $H_2$ and $O_2$ in said chamber to form said $H_2/H_2O$ ambient.

19. The method of claim 16 wherein said $H_2/H_2O$ ambient is formed external to said chamber.

20. A method of selectively oxidizing an electrode comprising:

placing a substrate into a reaction chamber, said substrate having an electrode comprising a lower polysilicon film, a tungsten nitride barrier layer on the polysilicon film, and a tungsten film on the tungsten nitride barrier layer;

providing nitrogen gas ($N_2$) into said chamber while ramping said substrate temperature from a first temperature of less than 100° C. to a second temperature greater than 800° C.;

after ramping said substrate to said second temperature, providing $H_2$ and $O_2$ into said chamber and reacting said $H_2$ and $O_2$ in said chamber to form an oxidizing ambient comprising $H_2$ and $H_2O$ wherein said oxidizing ambient consist of between 5–20% $H_2O$ and between 95–80% $H_2$.

* * * * *